US012749645B2

(12) United States Patent
Breuer et al.

(10) Patent No.: US 12,749,645 B2
(45) Date of Patent: Sep. 29, 2026

(54) METHOD OF CHARACTERIZING A DETECTION PATH OF A CHARGED PARTICLE BEAM AND A CHARGED PARTICLE MIRROR

(71) Applicant: ICT Integrated Circuit Testing Gesellschaft für Halbleiterprüftechnik mbH, Heimstetten (DE)

(72) Inventors: John Breuer, Munich (DE); Pieter Kruit, Delft (NL)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 374 days.

(21) Appl. No.: 18/384,746

(22) Filed: Oct. 27, 2023

(65) Prior Publication Data

US 2025/0140511 A1 May 1, 2025

(51) Int. Cl.

*H01J 37/147* (2006.01)
*H01J 37/244* (2006.01)
*H01J 37/28* (2006.01)

(52) U.S. Cl.

CPC ........ *H01J 37/1472* (2013.01); *H01J 37/244* (2013.01); *H01J 37/28* (2013.01); *H01J 2237/2826* (2013.01)

(58) Field of Classification Search

CPC ...... H01J 37/1472; H01J 37/244; H01J 37/26; H01J 37/153; H01J 2237/2826

See application file for complete search history.

(56) References Cited

U.S. PATENT DOCUMENTS 6,521,891 B1 * 2/2003 Dotan .................... H01J 37/21 250/307
2007/0194229 A1 * 8/2007 Okuda .................. H01J 37/026 250/310
2008/0035843 A1 * 2/2008 Hatano ................. H01J 37/244 250/288
2009/0224170 A1 * 9/2009 Yamazaki ........... H01J 37/3045 250/397
2009/0272899 A1 * 11/2009 Yamazaki ............ H01J 37/292 250/306

(Continued)

FOREIGN PATENT DOCUMENTS

JP 2007280614 A * 10/2007

*Primary Examiner* — David E Smith

(74) *Attorney, Agent, or Firm* — Kilpatrick Townsend & Stockton LLP

(57) ABSTRACT

A method of characterizing a detection path in a charged particle beam system having a primary charged particle beam, comprising positioning a charged particle mirror having a curved equipotential surface on a sample stage of the charged particle beam system; varying a reflection angle of the primary charged particle beam at the curved equipotential surface by varying a relative mirror position of the charged particle mirror, the curved equipotential surface being at a distance to a surface of the charged particle mirror, recording a plurality of detector signals of at least one detector of the charged particle beam system for a plurality of relative mirror positions; wherein varying a relative mirror position of the charged particle mirror comprises varying at least one of a mirror position of the charged particle mirror and a primary charged particle beam position with respect to each other in at least one dimension.

23 Claims, 4 Drawing Sheets

(56) References Cited

U.S. PATENT DOCUMENTS

| | | | | |
|---|---|---|---|---|
| 2014/0368186 | A1* | 12/2014 | Ikeda | G01N 23/22<br>324/96 |
| 2017/0345615 | A1* | 11/2017 | Zotta | G06V 10/42 |
| 2020/0292466 | A1* | 9/2020 | Hasegawa | G01N 21/956 |
| 2025/0054727 | A1* | 2/2025 | Nanao | H01J 37/3045 |

* cited by examiner

METHOD OF CHARACTERIZING A DETECTION PATH OF A CHARGED PARTICLE BEAM AND A CHARGED PARTICLE MIRROR

TECHNICAL FIELD

Embodiments described herein relate to methods of characterizing a detection path in a charged particle beam system, particularly in a scanning electron microscope (SEM). Specifically, a detection path of signal charged particles at a plurality of emission angles and emission energies can be characterized. Embodiments further relate to a charged particle mirror that is configured for any of the methods described herein.

BACKGROUND

Modern semiconductor technology has created a high demand for structuring and probing specimens on a nanometer or even sub-nanometer scale. Micrometer and nanometer-scale process control, inspection or structuring is often carried out using charged particle beams, e.g. electron beams, which are generated, shaped, deflected and focused in charged particle beam systems, such as electron microscopes or electron beam pattern generators. For inspection purposes, charged particle beams offer a superior spatial resolution compared to, e.g., photon beams.

Inspection apparatuses using charged particle beams such as scanning electron microscopes (SEM) have many functions in a plurality of industrial fields, including, but not limited to, inspection of electronic circuits, exposure systems for lithography, detecting systems, defect-inspection tools, and testing systems for integrated circuits. In particle beam systems, fine beam probes with a high current density can be used. For instance, in the case of an SEM, the primary electron beam generates signal particles such as secondary electrons (SE) and/or backscattered electrons (BSE) that can be used to image and/or inspect a sample.

Utilizing a charged particle beam system, a detection path can be calibrated using a known sample. The known sample can be, for example, a structured silicon wafer or a resolution target. For example, some methods include maximizing and/or increasing the detection signal by optimizing certain optical elements in the detection path like deflectors or lenses.

A sample emits a large spectrum of signal electrons (secondary and back-scattered electrons) with a large range of emission angles (starting angle of the signal electron from the wafer with respect to wafer normal). Signals collected during the maximizing and/or increasing of the detection signal of the detection path calibration having a mix of electrons that originated from the sample, e.g. with different angles. Calibrating a detection path with a mixture of signal electrons, i.e. electrons which are not well characterized, provides for an inferior beam path calibration.

In view of the above, it would be beneficial to accurately and reliably characterize the detection path of a charged particle beam system.

SUMMARY

In light of the above, a method of characterizing a detection path in a charged particle beam system and a charged particle mirror configured for characterizing a charged particle beam system are provided according to the independent claims.

According to an aspect, a method of characterizing a detection path in a charged particle beam system having a primary charged particle beam is provided. The method includes positioning a charged particle mirror having a curved equipotential surface on a sample stage of the charged particle beam system; varying a reflection angle of the primary charged particle beam at the curved equipotential surface by varying a relative mirror position of the charged particle mirror, the curved equipotential surface being at a distance to a surface of the charged particle mirror; recording a plurality of detector signals of at least one detector of the charged particle beam system for a plurality of relative mirror positions; wherein varying a relative mirror position of the charged particle mirror includes varying at least one of a mirror position of the charged particle mirror and a primary charged particle beam position with respect to each other in at least one dimension.

According to an aspect, a charged particle mirror, configured for characterizing a charged particle beam system according to any of the methods described herein, is provided.

According to an aspect, a charged particle mirror, including a substrate; a mirror element having a pillar recessed with respect to a surface of the substrate; wherein the pillar includes one of a conductive connection configured for connecting the pillar to a voltage source; a conductive element being configured for generating a curved equipotential surface when a voltage is applied; and wherein the pillar is rotationally symmetric, is provided.

Embodiments are also directed at systems and apparatuses for carrying out the disclosed methods and include parts for performing the individual method actions. The described method may be performed by way of hardware parts, a computer programmed by appropriate software, by any combination of the two or in any other manner. Furthermore, embodiments are also directed at methods of operating the described systems and apparatuses.

Further advantages, features, aspects and details that can be combined with embodiments described herein are evident from the dependent claims, the description and the drawings.

BRIEF DESCRIPTION OF THE DRAWINGS

So that the manner in which the above recited features of the present disclosure can be understood in detail, a more particular description, briefly summarized above, may be had by reference to embodiments. The accompanying drawings relate to one or more embodiments and are described in the following.

DETAILED DESCRIPTION

Reference will now be made in detail to the various embodiments, one or more examples of which are illustrated in the figures. Within the following description of the drawings, same reference numbers refer to same components. Generally, only the differences with respect to individual embodiments are described. Each example is provided by way of explanation and is not meant as a limitation. Further, features illustrated or described as part of one embodiment can be used on or in conjunction with other embodiments to yield yet a further embodiment. It is intended that the description includes such modifications and variations.

Figure 1:
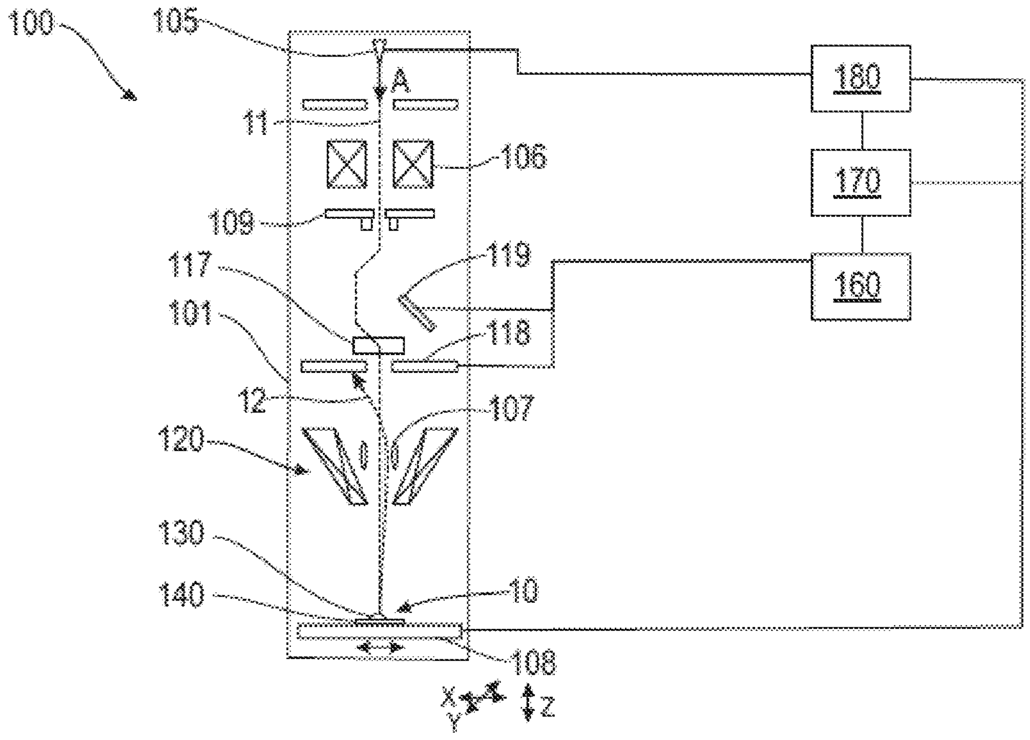
FIG. 1 shows a schematic view of a charged particle beam system according to embodiments described herein that is adapted for being operated according to any of the methods described herein.

FIG. 1 is a schematic view of a charged particle beam system 100 for inspecting and/or imaging a sample according to embodiments described herein. The charged particle beam system 100 includes a charged particle source 105, particularly an electron source, for emitting a primary charged particle beam 11, particularly an electron beam. The primary charged particle beam 11 propagates along an optical axis A of the charged particle beam system 100. The charged particle beam system 100 further includes a sample stage 108 and a focusing lens 120. The focusing lens 120, particularly an objective lens, focuses the primary charged particle beam 11 on a sample at a sample position on the sample stage 108. In some embodiments, the focusing lens 120 is an objective lens configured to focus the primary charged particle beam 11 on the charged particle mirror 10. The objective lens may particularly be a magnetic objective lens, an electrostatic magnetic lens, or a combined magnetic-electrostatic lens. The objective lens may optionally include a retarding field device, e.g. one or more retarding electrodes, configured to decelerate the charged particle beam to a predetermined landing energy on the sample.

The charged particle beam system 100 further includes charged particle detectors 118, 119, particularly electron detectors. The charged particle detectors 118, 119 may be configured to detect signal particles of a signal charged particle beam 12, in particular secondary electrons and/or backscattered electrons. The charged particle detectors 118, 119 may include multiple detectors 118, 119 or detector elements.

The beam-optical components of the charged particle beam system 100 are typically placed in a vacuum chamber 101 that can be evacuated. The primary charged particle beam 11 can typically propagate along the optical axis A from the charged particle source 105 toward the sample stage 108 and hit the sample at a sub-atmospheric pressure, e.g. a pressure below $10^{-3}$ mbar or a pressure below $10^{-5}$ mbar.

In some embodiments, a condenser lens system 106 may be arranged downstream of the charged particle source 105, particularly for collimating the primary charged particle beam 11 propagating toward the focusing lens 120. In some embodiments, the charged particle beam system may include a beam influencing element 109 to influence the primary charged particle beam 11.

In some embodiments, the charged particle beam system 100 may be an electron microscope, particularly a scanning electron microscope. A scan deflector 107 may be provided for scanning the primary charged particle beam 11 over the sample at the sample position of the sample stage 108.

On the sample stage, a charged particle mirror 10 is placed. The charged particle mirror 10 includes a substrate 140 and a mirror element 130. The mirror element 130 is supported by or integrated in the substrate 140. The substrate 140 may have a plurality of mirror elements 130, in particular a plurality of mirror elements 130 with a different design and/or at different positions. In some embodiments, a surface of the substrate 140 may define a sample plane or an imaging plane. In some embodiments, the mirror element 130 may include a curved surface, in particular a spherical surface.

The sample stage 108 can be moved in at least one dimension, particularly in one dimension of the sample plane. The sample plane is substantially perpendicular to the optical axis A and is the plane in which a sample is positioned in the charged particle beam system 100 to be inspected. The sample stage 108 may exemplarily be moved in an x direction and/or in a y-direction. The sample stage 108 may be moved continuously or step-wise.

In some embodiments, the charged particle mirror 10, in particular the mirror element 130 may be at an electric potential. In some embodiments, the mirror element 130 may be connected to a voltage source, that may exemplarily allow to set the mirror element 130 at a predefined electric potential. In some embodiments, the charged particle mirror 10 may be charged using a charged particle beam, in particular the primary charged particle beam 11. The charged particle mirror 10 includes an equipotential surface at which charged particles of the primary charged particle beam are reflected. The equipotential surface of the charged particle mirror 10 is at a distance to the surface of the charged particle mirror 10. The equipotential surface of the charged particle mirror 10 can be convex or concave. The shape of the equipotential surface depends on a charge distribution within the charged particle mirror 10, in particular within the mirror element 130.

In the embodiments described herein, the detectors 118, 119 detect charged particles, in particular electrons, of the primary charged particle beam 11 after reflection at the charged particle mirror 10. The primary charged particle beam 11 includes charged particles. The charged particles reflected at the charged particle mirror 10 are considered as the signal charged particle beam 12 in the embodiments described herein. The charged particle beam system 100 includes a beam separator 117 that may separate the signal charged particle beam 12 from the primary charged particle beam 11. Employing charged particles reflected at the charged particle mirror 10 as the signal charged particle beam 12 to characterize the detection path advantageously allows to use charged particles reflected at a defined angle. Further, employing charged particles reflected at the charged particle mirror 10 as the signal charged particle beam 12 to characterize the detection path advantageously allows to use charged particles with a defined energy. The detection path may be determined by the beam influencing elements, e.g. all beam influencing elements, and/or electromagnetic fields between the sample, or the charged particle mirror 10, and the detectors 118, 119 and/or the beam separator 117. The detection path may be influenced by optional secondary beam optics.

A detector signal receiving unit 160 may be provided for receiving one or more detector signals of the detectors 118, 119 of the charged particle beam system 100. The detector signal receiving unit 160 can forward the one or more detector signals of the detectors 118, 119 to a processing unit

170 that is configured to process the detector signals in accordance with the methods described herein. The processing unit 170 can communicate with the sample stage 108. In particular, the processing unit 170 can receive information on the position of the sample stage 108 and can determine the mirror position of the charged particle mirror 10. The processing unit 170 can associate a detector signal received by the detector signal receiving unit 160 from the detectors 118, 119, with the position of the sample stage 108 and with a position of the charged particle mirror 10.

In some embodiments, a method of characterizing a detection path in the charged particle beam system 100 having the primary charged particle beam 11, may include positioning the charged particle mirror 10 on the sample stage 108 of the charged particle beam system 100, particularly on the optical axis of the charged particle beam device; a relative mirror position of the charged particle mirror 10 can be varied by scanning the primary charged particle beam over the charged particle mirror in at least one dimension; recording 630 a plurality of detector signals of the at least one detector 118, 119 of the charged particle beam system 100 for a plurality of mirror positions; wherein the charged particle mirror includes a curved equipotential surface.

In some embodiments, a method of characterizing a detection path in the charged particle beam system 100 having the primary charged particle beam 11, may include positioning the charged particle mirror 10 on the sample stage 108 of the charged particle beam system 100; varying a relative mirror position of the charged particle mirror 10 by varying at least one of the mirror position of the charged particle mirror 10 and a primary charged particle beam position with respect to each other in at least one dimension of a sample plane; recording 630 a plurality of detector signals of the at least one detector 118, 119 of the charged particle beam system 100 for a plurality of mirror positions; wherein the charged particle mirror 10 includes a curved equipotential surface.

Characterizing a detection path has the advantage to allow for gray level matching. Beyond inspecting and/or imaging samples with a charged particle beam system 100 based on the resolution, also a matching of a beam path, particularly of a signal charged particle beam path, between the sample and detectors 118, 119 of the charged particle beam system 100 can be provided. The matching, also described as gray level matching, can be beneficial in critical dimension measurements, but also in inspection and defect review applications. Gray level matching may also include a matching of detector 118, 119 sensitivities.

Upon irradiation of the sample by a primary charged particle beam 11, secondary electrons (SE) and/or backscattered electrons (BSE) are created as the signal charged particle beam 12, which carries information about the topography of the sample, the chemical constituents of the sample, the electrostatic potential of the sample and other information. SE are collected and lead to a detector 118, 119, including a sensor, particularly a scintillator, a pin diode or the like. An image is created where the gray level is proportional to the number of charged particles, particularly electrons, collected. However, a detection efficiency, in particular the ratio of emitted electrons and detected electrons, may be different for different sample properties. In particular, in the charged particle beam system 100, the detection efficiency may be different for different emission angles of the signal charged particle beam 12. Exemplarily, signal charged particles, such as SE and BSE, emitted at a first angle with respect to the primary charged particle beam 11 may have a higher detection efficiency than signal charged particles emitted at a second angle. Further, SEs with a lower energy may have a higher detection efficiency as compared to BSEs having a higher energy. The detection efficiency for a particular angle may be different at different charged particle energies and may vary between different charged particle beam systems 100. The detection efficiency for secondary electrons may be different from the detection efficiency for BSE at a particular angle.

A characterized detection path, as provided by the methods described herein, may further be employed to better align the detection path in a charged particle beam system 100, in particular in an electron microscope. This may include a comparison of detection paths of a plurality of charged particle beam systems 100. A comparison of detection paths may be used to align the plurality of charged particle beam systems 100 to have detection paths that exhibit more resemblance to each other and/or to a predefined detection path.

A controller 180 may be provided for controlling the charged particle beam system 100. The controller 180 may communicate with the sample stage 108. In particular, the controller 180 may set the relative mirror position of the charged particle mirror 10 by controlling the sample stage 108. The controller 180 may instruct the sample stage 108 to vary the mirror position of the charged particle mirror 10 according to a predetermined pattern. The controller 180 may instruct the sample stage 108 to vary the mirror position in response to an information received, in particular an information received from the processing unit 170, in particular in response to the signal of the detectors 118, 119 at a particular position of the sample stage 108 and/or of the charged particle mirror 10. The controller 180 may control the sample stage 108 to vary the mirror position in two dimensions, in particular according to a cartesian coordinate system (with exemplary dimensions x and y) or according to a polar coordinate system (with exemplary dimensions r and q). The predetermined pattern can ensure that a plurality of positions of the charged particle mirror, particularly the entire charged particle mirror 10 is measured by the primary charged particle beam 11. This advantageously enables that a large variety of reflection angles provided by the charged particle mirror 10 may be measured. A reflection angle may depend on the energy of the charged particles, in particular of a voltage setting of the charged particle source 105 and of a voltage setting of the charged particle mirror 10. The reflection angle may depend on the mirror position of the charged particle mirror 10. Generally, the charged particle energy and the mirror position can be well controlled in a charged particle beam system. In typical embodiments, reflection angles between −75° to 75°, −60° to 60° or −45° to 45° may be achieved.

The processing unit 170 may associate the information on the relative mirror position with respect to the primary charged particle beam 11, in particular the mirror position, of the charged particle mirror 10 received from the sample stage 108 with the reflection angle of the primary charged particle beam 11. In particular, the processing unit may associate the position of the charged particle mirror 10 with the reflection angle along a known shape of an equipotential surface of the charged particle mirror 10.

The controller 180 may further vary the energy of the charged particles of the primary charged particle beam 11, i.e. the landing energy of the primary charged particle beam on a sample (without a mirror). The controller 180 may vary the energy of the charged particles of the primary charged particle beam 11 in predefined steps, in particular in a range from 10 eV to 10 keV. The detector signals of the detectors

118, 119 may be received by the receiving unit 160 at a plurality of energies of the charged particles of the primary charged particle beam 11. In particular, the detector signals may be received at a plurality of mirror positions, i.e. correlated starting angles, of charged particle mirror 10 with charged particles of the primary charged particle beam 11 having a plurality of energies.

The controller 180 may map the detector signals of the detectors 118, 119 over the mirror position of the charged particle mirror 10. The controller 180 communicates with the charged particle source 105, in particular to control the charged particle source 105 and/or to receive information from the charged particle source 105. The controller 180 may receive information on the primary charged particle beam 11, in particular from the charged particle source 105, and may compare a signal detected by the detectors 118, 119 of the signal charged particle beam 12 with the information on the primary charged particle beam 11 to determine a detection efficiency for a particular reflection angle and, for example, at a predetermined charged particle energy. The controller 180 may control the charged particle beam system 100, in particular the charged particle source 105 and/or the sample stage 108, to record the detection efficiency for a plurality of mirror positions of the charged particle mirror 10 and/or for a plurality of charged particle energies. Exemplarily, the controller may record the detection efficiency in the form of a two-dimensional map with the detection efficiency of the charged particles being a third dimension.

One or more charged particle mirrors 10 can be inspected and/or imaged with the charged particle beam system 100. In particular, a plurality of charged particle mirrors 10 may be positioned on the sample stage 108 in the imaging plane of the charged particle beam system 100. In some embodiments, a charged particle mirror 10 may include a plurality of mirror elements 130 on the substrate. According to some embodiments, which can be combined with other embodiments described herein, a plurality of primary charged particle beams or a plurality of primary charged particle beamlets can be characterized with a plurality of charged particle mirror elements provided on a substrate of the charged particle mirror.

Figure 2:
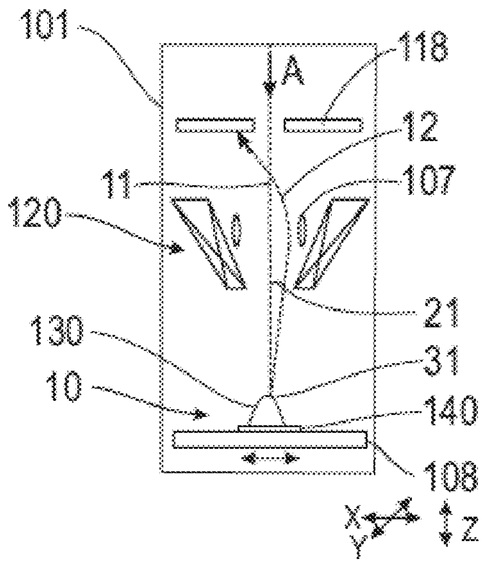
FIG. 2 shows charged particle beam paths of FIG. 1 in more detail and illustrates a charged particle mirror according to embodiments of the present disclosure.
Figure 3:
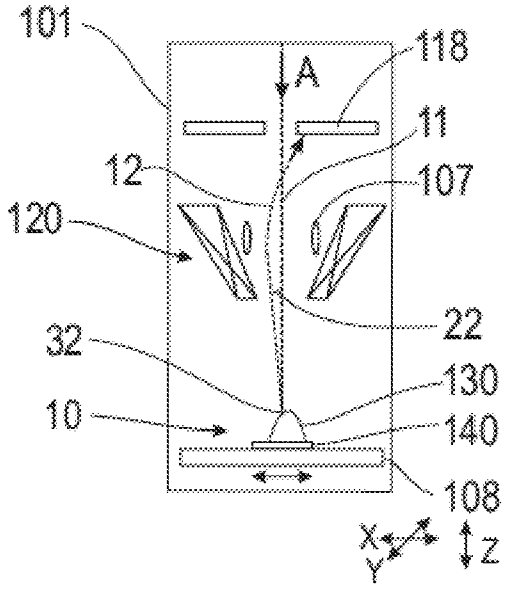
FIG. 3 shows charged particle beam paths of the charged particle beam system of FIG. 1 in detail, similar to FIG. 2, at a different mirror position of the charged particle mirror.

FIGS. 2 and 3 describe the charged particle beam paths in more detail. In FIG. 2, the reflection of the primary charged particle beam 11 at the charged particle mirror 10 is shown in more detail. The primary charged particle beam 11 propagates along the optical axis A towards the sample stage 108. On the sample stage 108, the charged particle mirror 10 is positioned. The reflection point 31 of the charged particle mirror 10, in particular of the mirror element 130, at which the primary charged particle beam 11 is reflected, varies depending on the position of the sample stage 108. After reflection, for example above a surface of a mirror element 130, in particular at a distance to a physical surface of the surface of the mirror element 130, the reflected charged particles form the signal charged particle beam 12. Depending on the reflection point 31, the primary charged particle beam 11 is reflected at a reflection angle 21. By varying the relative mirror position of the charged particle mirror 10 with respect to the primary charged particle beam 11, e.g. by moving the sample stage 108, the primary charged particle beam 11 is reflected at another reflection angle 22, as shown in FIG. 3. By further varying the relative mirror position of the charged particle mirror with respect to the primary charged particle beam, a plurality of reflection angles of the primary charged particle beam 11 can be measured, in particular by sampling the surface of the charged particle mirror 10 and the mirror element 130 of the charged particle mirror 10 positioned on the sample stage 108. This may lead, depending on the shape of the mirror element 130, in particular of the curved equipotential surface of the mirror element 130, to the primary charged particle beam 11 being reflected at a plurality of reflection angles. The signal charged particle beam 12, as reflected from the charged particle mirror 10, is detected at a plurality of charged particle detectors 118 and the detection efficiency can be determined for a variety of reflection angles 21 that resemble emission angles when the charged particle beam system 100 is employed to measure a sample. Determining detection efficiencies for a variety of reflection angles 21 allows to accurately calibrate the signal intensity for a plurality of emission angles when using the charged particle beam system 100 to investigate a sample.

As shown in FIG. 2 and FIG. 3, a variation of the position of the sample stage 108 with the charged particle mirror 10 leads to a variation of the reflection point 31, 32 of the primary charged particle beam 11. This causes the reflection angle 21, 22, at which the primary charged particle beam 11 is reflected and subsequently forms the signal charged particle beam 12, to vary as well. This leads to a variation of the beam path of the signal charged particle beam 12. Exemplarily, in FIG. 2, the primary charged particle beam 11 is reflected and subsequently forms the signal charged particle beam 12 with a component in positive x-direction. After passing the focusing lens 120, the signal charged particle beam 12 is deflected onto one of the charged particle detectors 118. In FIG. 3, the primary charged particle beam 11 is reflected at a different reflection point 32 and at a different reflection angle 22 than in FIG. 2, exemplarily with a component in the negative x-direction. The beam path of the signal charged particle beam 12 in FIG. 3 is different from the beam path of the signal charged particle beam 12 in FIG. 2. Thus, the signal charged particle beam 12 in FIG. 3 is detected at a different position on the charged particle detector 118, for example a segmented detector. According to some embodiments, the different signal beam paths can result in a detection at a different position on the charged particle detector, detection at a different charged particle detector, or no detection of the signal charged particle on a detector.

In some embodiments, which can be combined with other embodiments described herein, the primary charged particle beam 11 may be scanned over the charged particle mirror 10. In particular, the sample stage 108 may remain in a fixed position and the reflection point 31, 32 of the charged particle beam may vary due to a variation in the beam path of the primary charged particle beam 11.

In some embodiments, a path of the primary charged particle beam 11 may be changed to vary the relative mirror position of the charged particle mirror with respect to the primary charged particle beam 11. In particular, the reflection point 31, 32 of the primary charged particle beam 11 may be varied by scanning the primary charged particle beam 11 over at least a part of the charged particle mirror 10, in some embodiments over the entire charged particle mirror 10. The scanning of the primary charged particle beam 11 may be controlled by the controller 180, in particular by controlling the charged particle beam system 100. Exemplarily, the focusing lens 120 may be controlled to vary the relative mirror position of the charged particle mirror 10 with respect to the primary charged particle beam 11. In some embodiments, the relative mirror position of the charged particle mirror 10 may be varied with respect to the primary charged particle beam 11 by a combination of a variation of the sample stage 108 position and a variation of the beam path of the primary charged particle beam 11. Exemplarily, larger structures may be sampled by a variation of the sample stage 108 position and smaller structures may be sampled by a variation of the beam path of the primary charged particle beam 11.

In some embodiments, not shown in the Figures, in particular at small reflection angles, the primary charged particle beam 11 may be reflected at small reflection angles 21, 22. The signal charged particle beam 12 may have a beam path closer to the optical axis A or substantially parallel to the optical axis A and/or the primary charged particle beam 11 path. Going back to FIG. 1, the beam separator 117 separates charged particle beams, in particular the signal charged particle beam 12 from the primary charged particle beam 11. The signal charged particle beam 12 is deflected by the beam separator 117 and is detected by the charged particle detector 119.

In FIG. 1-3, the charged particle mirror 10, in particular the mirror element 130 of the charged particle mirror, has a concave surface. In particular, the mirror element 130 of the charged particle mirror 10 has a concave equipotential surface on which all reflection points 31, 32 are situated. A concave mirror element 130 may be produced at a particularly small scale. In some embodiments, which can be combined with other embodiments described herein, the mirror element 130 is rotationally symmetric, in particular n-fold rotationally symmetric, with n being a natural number. In some embodiments, the equipotential surface of the charged particle mirror 10, in particular of the mirror element 130 of the charged particle mirror 10, is rotationally symmetric, in particular n-fold rotationally symmetric, with n being a natural number. In particular, the equipotential surface of the mirror element 130 may be ellipsoidal.

Figure 4:
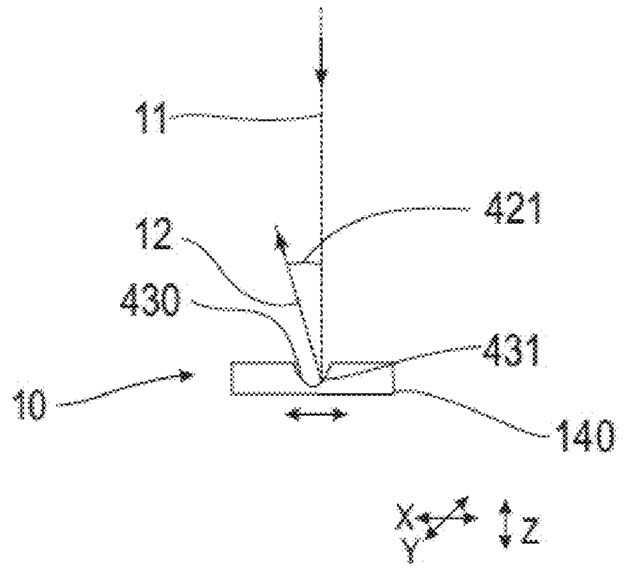
FIG. 4 shows an alternative design of the charged particle mirror.
Figure 5:
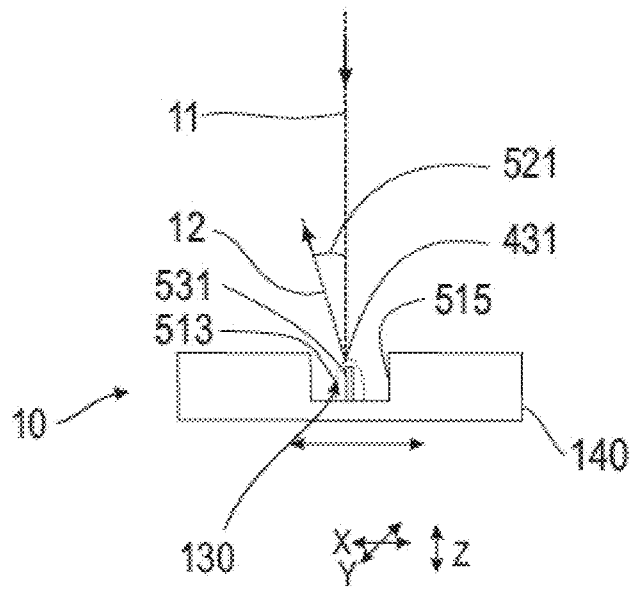
FIG. 5 shows an alternative design of the charged particle mirror.

In FIG. 4 and FIG. 5, alternative charged particle mirror designs are shown, which can be combined with other embodiments described herein. In particular to resolve large reflection angles 21, 22, 421, 521, a convex charged particle mirror may be employed. In FIG. 4, a convex charged particle mirror 10, including the substrate 140 and a convex mirror element 430, is shown. The equipotential surface of the charged particle mirror 10 is recessed with respect to a surface of the substrate 140 parallel to the surface of the sample stage 108, in particular recessed with respect to a surface parallel to the sample plane. In FIG. 4, the primary charged particle beam 11 is reflected at the reflection point 431 of the equipotential surface of the charged particle mirror 10 at a reflection angle 421. The reflection point 431 may be positioned at a distance from the surface of the charged particle mirror 10. The distance between the surface of the charged particle mirror 10 and the equipotential surface, in particular the reflection point 431, depends on the energy of the primary charged particle beam 11 and the potential of the mirror element 130. The convex charged particle mirror 10 may in particular be employed to determine the detection efficiency at large reflection angles 421, that represent large emission angles.

In FIG. 4, the mirror element 430 of the charged particle mirror 10 has a convex surface. In particular, the charged particle mirror 10 has a convex equipotential surface on which all reflection points 431 are situated. In some embodiments, the mirror element 430 is rotationally symmetric, in particular n-fold rotationally symmetric, with n being a natural number. In some embodiments, which can be combined with other embodiments described herein, the equipotential surface of the mirror element 430 is rotationally symmetric, in particular n-fold rotationally symmetric, with n being a natural number. In particular, the equipotential surface of the mirror element 430 may be ellipsoidal.

In FIG. 5, the charged particle mirror 10 includes a recess 515 in the substrate 140 in which a pillar 531 is positioned as mirror element 530. The pillar 531 is recessed with respect to the sample plane of the charged particle beam system 100. The pillar 531 may have a main axis substantially parallel to the optical axis A of the charged particle beam system 100 and/or to the primary charged particle beam 11. The pillar 531 may be recessed with respect to the sample plane of the charged particle beam system 100 such that the equipotential surface 513 at the center of the pillar 531 is substantially equal in height (z-direction in FIG. 5) with the sample plane when the pillar 531 is at a potential. In particular, the pillar 531 may be recessed to the sample plane such that the reflection point of the primary charged particle is substantially equal in height (z-direction in FIG. 5) with the sample plane when the pillar 531 is at a potential.

The pillar 531 may be a cylinder, a cone, or a frustum of a cone. The pillar 531 may be rotational symmetric or may be n-fold rotationally symmetric. The recess 515 may be rotational symmetric or may be n-fold rotationally symmetric and may have the form of a cylinder, a cone, or a frustum of a cone. The pillar 531 may advantageously be produced employing MEMS, microelectromechanical systems, manufacturing methods or conventional semiconductor structure methods, which may imply some deviations of the shapes mentioned above.

The pillar 531, in particular the geometry of the pillar 531, may be configured to provide an equipotential surface 513, which is convex or concave. A mirror voltage can be applied at the pillar, for which a curved equipotential surface that reflects the beam is created. Employing a charged particle mirror 10 including the pillar 531 as the mirror element 530 is particularly advantageous due to the curved equipotential surface 513 being well-defined.

In some embodiments, the charged particle mirror 10 may be a conductor or may include a conductor. In some embodiments, the mirror element 130, 430, 530 may be a conductor. The potential of the charged particle mirror may be adjusted by the voltage source conductively connected by a conductive connection to the charged particle mirror 10. A substrate, which may support the charged particle mirror 10, may be an isolator, in particular isolated from the charged particle mirror 10. According to some embodiments, an insulator can be provided between the substrate and a conductive surface of the mirror element 130.

In some embodiments, which can be combined with other embodiments described herein, the charged particle mirror 10 may be insulated. In some embodiments, the mirror element 130, 430, 530 may be insulated. In some embodiments, the mirror element 130, 430, 530 may be conductive and the substrate 140 of the charged particle mirror 10 may be insulated. The mirror element 130, 430, 530 may be charged applying a charged particle beam prior to the measurement of the detection efficiency. In some embodiments, the charged particle mirror 10 may be an insulator. In some embodiments, the mirror element 130, 430, 530 may be an insulator. A charged particle beam employed to charge the mirror element 130, 430, 530 until a predefined potential is reached has a higher energy than the primary charged particle beam 11. This advantageously avoids a separate voltage supply and/or a feedthrough.

Figure 6:
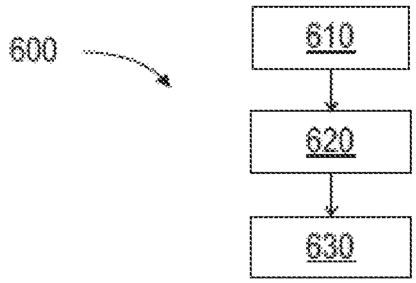
FIG. 6 shows a flow diagram illustrating a method of characterizing a detection path in a charged particle beam system according to embodiments described herein.
Figure 7:
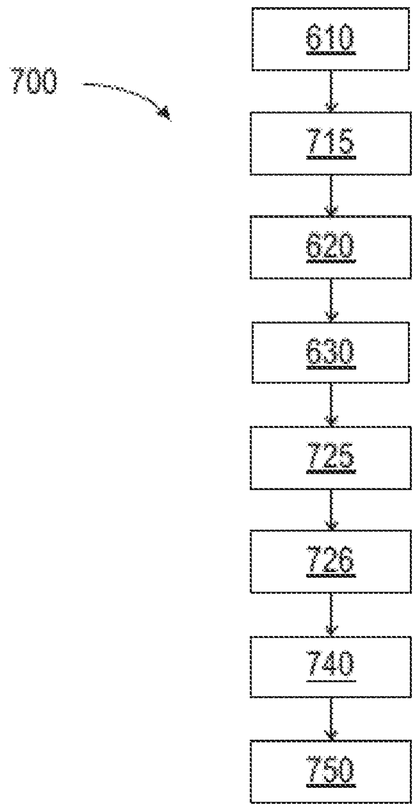
FIG. 7 shows the flow diagram illustrating the method of characterizing a detection path in a charged particle beam system of FIG. 6 with additional optional operations according to embodiments described herein.

In FIG. 6, a method 600 of characterizing a detection path in the charged particle beam system is shown schematically as a flow diagram. FIG. 7 shows the method 700, including the method 600 of FIG. 7 with additional, optional, operations. In a first operation 610, the charged particle mirror 10 is positioned on the sample stage 108, in particular the charged particle mirror 10 may be positioned such that the equipotential surface 513 at the center of the charged particle mirror 10, in particular at the center of the equipotential surface of the mirror element 130, is substantially equal to the sample plane in height (z-direction in FIG. 1-5).

In FIG. 7, after operation 610, if the mirror element 130, 430, 530 is insulated and/or is an insulator, the mirror element 130, 430, 530 may be charged with a charged particle beam having an energy exceeding the energy of the primary charged particle beam 11 when used to measure a sample or the charged particle mirror 10. The mirror element 130, 430, 530 is charged until a predefined potential is reached. After the predefined potential is reached, the energy of the primary charged particle beam 11 is set at the level used to calibrate the detection efficiency.

Returning to FIG. 6, after positioning the charged particle mirror 10 and charging the mirror element 130, 430, 530 of the charged particle mirror 10, exemplarily by a higher energy charged particle beam as described in operation 715 or by applying a voltage by the voltage source, the primary charged particle beam 11 is used to probe the charge particle beam mirrors at a first position of the charged particle mirror 10. To assess a plurality of positions of the charged particle mirror 10, in particular to obtain a plurality of reflection angles 21, 22, 421, 521, the position of the sample stage 108 is varied in operation 620. Varying the position of the sample stage 108 may include varying the position of the sample stage 108 in a predefined pattern. The predefined pattern may ensure that a plurality of reflection angles 21, 22, 421, 521 of the reflection of the primary charged particle beam 11 are measured. Varying the position of the sample stage 108 may include varying the position of the sample stage 108 in at least two dimensions, in particular according to a cartesian coordinate system (with exemplary dimensions x and y) or according to a polar coordinate system (with exemplary dimensions r and φ). In some embodiments, varying the position of the sample stage may include varying the position in the direction parallel to the optical axis A (z-direction in FIG. 1-5).

In some embodiments, to assess a plurality of positions of the charged particle mirror 10, in particular to obtain a plurality of reflection angles 21, 22, 421, 521, the primary charged particle beam position is varied in operation 620, in particular by scanning the primary charged particle beam 11 over the charged particle mirror 10. Varying the primary charged particle beam position may include varying the primary charged particle beam position in a predefined pattern. The predefined pattern may ensure that a plurality of reflection angles 21, 22, 421, 521 of the reflection of the primary charged particle beam 11 are measured. Varying the primary charged particle beam position may include varying the primary charged particle beam position in at least two dimensions, in particular according to a cartesian coordinate system (with exemplary dimensions x and y) or according to a polar coordinate system (with exemplary dimensions r and φ).

For each of the plurality of the relative mirror positions of the charged particle mirror 10 a detector signal, e.g. for each detector, of the signal charged particle beam 12 at the charged particle beam detectors 118, 119 is recorded 630. In particular, the signal intensity of the plurality of detector signals and/or the spatial distribution of the signal intensity of the plurality of detector signals is recorded. To correlate a relative mirror position of the charged particle mirror 10 with the reflection angle 21, 22, 421, 521, the known equipotential surface 513 of the charged particle mirror 10 is associated 725 with the relative mirror position of the charged particle mirror 10. For the detector signal at one position of the charged particle mirror 10, the reflection angle 21, 22, 421, 521 is associated with the detector signal.

In operation 740, the plurality of detector signals at one position of the charged particle mirror 10 are associated with the reflection angle 21, 22, 421, 521. Varying the relative mirror position of the charged particle mirror 10 allows to map the detector signals of the charged particle detectors 118, 119 for a plurality of reflection angles 21, 22, 421, 521 of the primary charged particle beam 11.

In some embodiments, in addition to the relative mirror position of the charged particle mirror 10, the energy of the primary charged particle beam 11 is varied 726. The energy may be varied by varying the potential of the charged particle source 105. The energy of the primary charged particle beam 11 may be varied for one or more of the plurality of relative mirror positions, particularly for each plurality of the positions of the charged particle mirror 10 and associated for each of the reflection angles 21, 22, 421, 521, or for some of the positions of the charged particle mirror 10. Different energies of the primary charged particle beam 11 result in signal charged particle beams 12 with a varying energy. This allows to characterize the detection path for different emission energies from a sample. According to some embodiments, which can be combined with other embodiments described herein, the mirror element of the charged particle mirror may reflect a focused primary charged particle beam or a charged particle beam, which is un-focused or not fully focused, e.g. in light of the varying energy of the primary charged particle beam. Accordingly, embodiments of the present disclosure may advantageously be used for characterizing signal beam path for different primary beam energies.

In some embodiments, which can be combined with other embodiments described herein, the energy of the primary charged particle beam 11 is varied after the relative mirror position of the charged particle mirror 10 has been varied until a plurality of predefined positions, exemplarily all predefined positions, have been measured, in particular after the relative mirror position of the charged particle mirror 10 has been varied following the predefined pattern. In some embodiments, which can be combined with other embodiments described herein, the energy of the primary charged particle beam 11 is changed prior to the variation of the relative mirror position of the charged particle mirror 10.

To determine 750 the detection efficiency of the charged particle beam system 100 for the plurality of reflection angles 21, 22, 421, 521, the potential of the charged particle source 105 may be determined, e.g. to adapt the landing energy of the primary charged particle beam. The signal intensity of the detector signals of the signal charged particle beam 12 for each of the plurality of the positions of the charged particle mirror is associated with estimated detector signals based upon the landing energy of the primary charged particle beam. For each of the reflection angles 21, 22, 421, 521 and/or for each of the energies of the primary charged particle beam 11, the detection efficiency may be determined.

From the plurality of detection efficiencies for the plurality of reflection angles and/or for the plurality of charged particle energies, a representation, particularly a map, may be created that describes the detection efficiencies for different emission angles and different emission energies from a sample. The representation may be employed to calibrate measured signals from a sample for the different detection efficiencies at the plurality of emission angles.

In some embodiments, different charged particle beam systems 100 may be compared. In particular, different charged particle beam systems 100 may be compared to compensate for differences in the detection efficiency and/or the detection path, particularly at the same energies of the same primary charged particle beam 11 or at the same reflection angles 21, 22, 421, 521. In some embodiments, the charged particle beam system 100 may be calibrated in regular intervals with the charged particle mirror 10.

In some embodiments, a metric describing the detection efficiency is formed. The metric may be employed to correct an SEM image in a post-processing process, in particular in a process to determine critical dimensions of a sample. Advantageously, images taken at different charged particle beam systems 100 may be better matched. In some embodiments, an algorithm may employ the metric to adjust an SEM image taken at one charged particle beam system 100, to match the gray level of another charged particle beam system 100, in particular to a reference charged particle beam system 100.

According to some embodiments, charged particle optical components may be adjusted based on the representation of the signal beam characterization. For example, the charged particle beam system and/or the optical elements therein may be aligned. Further, the signal and/or primary charged particle beam may be aligned in the charged particle beam system based upon the representation or the map of the characterization of the signal charged particle beam. For example, voltages and/or currents at deflectors or correctors may be adjusted (and/or calibrated) based on the characterization of the signal charged particle beam.

Specifically, the following embodiments are described herein:

Embodiment 1: A method of characterizing a detection path in a charged particle beam system having a primary charged particle beam, including: positioning a charged particle mirror having a curved equipotential surface on a sample stage of the charged particle beam system; varying a reflection angle of the primary charged particle beam at the curved equipotential surface by varying a relative mirror position of the charged particle mirror, the curved equipotential surface being at a distance to a surface of the charged particle mirror; recording a plurality of detector signals of at least one detector of the charged particle beam system for a plurality of relative mirror positions; wherein varying a relative mirror position of the charged particle mirror includes varying at least one of a mirror position of the charged particle mirror and a primary charged particle beam position with respect to each other in at least one dimension.

Embodiment 2: The method of embodiment 1, wherein the curved equipotential surface is rotationally symmetric.

Embodiment 3: The method of any of embodiments 1 to 2, wherein the charged particle mirror includes a mirror element being rotationally symmetric.

Embodiment 4: The method of any of embodiments 1 to 3, wherein the curved equipotential surface is a concave equipotential surface Embodiment 5: The method of any of embodiments 1 to 3, wherein the curved equipotential surface is a convex equipotential surface.

Embodiment 6: The method of any of embodiments aims 1 to 5, further including: associating the reflection angle of the primary charged particle beam with at least one of the relative mirror positions of the charged particle mirror with respect to the primary charged particle beam.

Embodiment 7: The method of embodiment 6, further including: associating the reflection angle of the primary charged particle beam with the at least one detector signal recorded at the respective relative mirror position of the charged particle mirror with respect to the primary charged particle beam.

Embodiment 8: The method of embodiment 7, further including: associating a detection efficiency with the reflection angle of the primary charged particle beam.

Embodiment 9: The method of embodiment 7, further including: creating a representation of the at least one detector signal recorded over a plurality of reflection angles.

Embodiment 10: The method of embodiment 9, wherein the representation includes the detector signal recorded over a plurality of energies of the primary charged particle beam.

Embodiment 11: The method of embodiment 9, further including: correcting an SEM image in a post-processing process based on the representation of the at least one detector signal recorded over the plurality of reflection angles.

Embodiment 12: The method of any of embodiments 1 to 11, further including: adjusting a mechanical position and/or voltages and/or currents of the charged particle optical components of the charged particle beam system based on the representation of the at least one detector signal recorded over the plurality of reflection angles.

Embodiment 13: The method of any of embodiments 1 to 12, further including: varying the energy of the primary charged particle beam.

Embodiment 14: The method of embodiment 13, wherein the energy of the primary charged particle beam is varied without changing settings of optical elements between the charged particle mirror and the detector.

Embodiment 15: The method of any of embodiments 13 to 14, wherein for a plurality of relative mirror positions, the plurality of detector signals is recorded for a plurality of energies of the primary charged particle beam.

Embodiment 16: The method of any of embodiments 1 to 15, wherein varying the relative mirror position of the charged particle mirror with respect to the primary charged particle beam includes varying the position of the charged particle mirror with respect to the primary charged particle beam in at least two dimensions.

Embodiment 17: The method of any of embodiments 1 to 16, wherein varying the relative mirror position of the charged particle mirror with respect to the primary charged particle beam includes scanning the primary charged particle beam over the charged particle mirror in at least two dimensions.

Embodiment 18: The method of any of embodiments 1 to 17, wherein the charged particle mirror includes a pillar.

Embodiment 19: The method of embodiment 18, wherein the pillar is recessed with respect to a sample plane of the charged particle beam system.

Embodiment 20: The method of embodiment 18, wherein the pillar is recessed with respect to the sample plane of the charged particle beam system such that a reflection point of a charged particle is substantially equal to the sample plane at the center of the pillar.

Embodiment 21: The method of any of embodiments 1 to 20, wherein the charged particle mirror includes a mirror element, wherein the mirror element is a conductor and wherein a potential of the mirror element is adjusted by a voltage source conductively connected to the charged particle mirror.

Embodiment 22: The method of any of embodiments 1 to 20, wherein the charged particle mirror includes a mirror element, wherein the mirror element is insulated and wherein the method of any of embodiments 1 to 20 further includes: charging the mirror element with a charged particle beam until a predefined potential is reached.

Embodiment 23: The method of any of embodiments 1 to 20, wherein the mirror element includes an insulator.

Embodiment 24: A charged particle mirror, configured for characterizing a charged particle beam system according to the method of any one of the preceding embodiments.

Embodiment 25: A charged particle mirror, including: a substrate; a mirror element having a pillar recessed with respect to a surface of the substrate; wherein the pillar includes one of: a conductive connection configured for connecting the pillar to a voltage source; a conductive element being configured for generating a curved equipotential surface when a voltage is applied; and wherein the pillar is rotationally symmetric.

Embodiments of the present disclosure provide one or more of the following advantages. The detection path may be characterized using charged particles reflected at a defined angle. The detection path may be characterized using a variety of reflection angles. The detection path may be characterized using charged particles reflected at a defined energy. Characterizing the detection path allows for gray level matching. The charged particle mirror may provide a well-defined curved equipotential surface.

While the foregoing is directed to embodiments, other and further embodiments may be devised without departing from the basic scope thereof, and the scope thereof is determined by the claims that follow.

What is claimed is:

1. A method of characterizing a detection path in a charged particle beam system having a primary charged particle beam, comprising positioning a charged particle mirror having a known curved equipotential surface on a sample stage of the charged particle beam system;

varying a reflection angle of the primary charged particle beam at the known curved equipotential surface by varying a relative mirror position of the charged particle mirror, the known curved equipotential surface being at a distance to a surface of the charged particle mirror; and recording a plurality of detector signals of at least one detector of the charged particle beam system for a plurality of relative mirror positions;

wherein varying the relative mirror position of the charged particle mirror comprises varying at least one of a mirror position of the charged particle mirror and a primary charged particle beam position with respect to each other in at least one dimension.

2. The method of claim 1, wherein the known curved equipotential surface is rotationally symmetric.

3. The method of claim 1, wherein the charged particle mirror comprises a mirror element being rotationally symmetric.

4. The method of claim 1, wherein the known curved equipotential surface is a concave equipotential surface.

5. The method of claim 1, wherein the known curved equipotential surface is a convex equipotential surface.

6. The method of claim 1, further comprising:

associating the reflection angle of the primary charged particle beam with at least one of the relative mirror positions of the charged particle mirror with respect to the primary charged particle beam.

7. The method of claim 6, further comprising:

associating the reflection angle of the primary charged particle beam with at least one detector signal recorded at the respective relative mirror position of the charged particle mirror with respect to the primary charged particle beam.

8. The method of claim 7, further comprising:

associating a detection efficiency with the reflection angle of the primary charged particle beam.

9. The method of claim 7, further comprising:

creating a representation of the at least one detector signal recorded over a plurality of reflection angles.

10. The method of claim 9, further comprising:

correcting an SEM image in a post-processing process based on the representation of the at least one detector signal recorded over the plurality of reflection angles.

11. The method of claim 9, further comprising:

adjusting at least one of a mechanical position, voltages, and currents of charged particle optical components of the charged particle beam system based on the representation of the at least one detector signal recorded over the plurality of reflection angles.

12. The method of claim 1, further comprising:

varying the energy of the primary charged particle beam.

13. The method of claim 12, wherein for a plurality of relative mirror positions, the plurality of detector signals is recorded for a plurality of energies of the primary charged particle beam.

14. The method of claim 1, wherein varying the relative mirror position of the charged particle mirror with respect to the primary charged particle beam comprises varying the position of the charged particle mirror with respect to the primary charged particle beam in at least two dimensions.

15. The method of claim 1, wherein varying the relative mirror position of the charged particle mirror with respect to the primary charged particle beam comprises scanning the primary charged particle beam over the charged particle mirror in at least two dimensions.

16. The method of claim 1, wherein the charged particle mirror comprises a pillar.

17. The method of claim 16, wherein the pillar is recessed with respect to a sample plane of the charged particle beam system.

18. The method of claim 16, wherein the pillar is recessed with respect to a sample plane of the charged particle beam system such that a reflection point of a charged particle is substantially equal to the sample plane at the center of the pillar.

19. The method of claim 1, wherein the charged particle mirror comprises a mirror element, wherein the mirror element is a conductor and wherein a potential of the mirror element is adjusted by a voltage source conductively connected to the charged particle mirror.

20. The method of claim 1, wherein the charged particle mirror comprises a mirror element, wherein the mirror element is insulated and wherein the method of claim 1 further comprises:

charging the mirror element with a charged particle beam until a predefined potential is reached.

21. The method of claim 1, wherein the charged particle mirror comprises a mirror element, and wherein the mirror element comprises an insulator.

22. A charged particle mirror configured for characterizing a charged particle beam system according to a method of characterizing a detection path in a charged particle beam system having a primary charged particle beam, the method comprising:

positioning a charged particle mirror having a known curved equipotential surface on a sample stage of the charged particle beam system;

varying a reflection angle of the primary charged particle beam at the known curved equipotential surface by varying a relative mirror position of the charged particle mirror, the known curved equipotential surface being at a distance to a surface of the charged particle mirror; and recording a plurality of detector signals of at least one detector of the charged particle beam system for a plurality of relative mirror positions;

wherein varying the relative mirror position of the charged particle mirror comprises varying at least one of a mirror position of the charged particle mirror and a primary charged particle beam position with respect to each other in at least one dimension.

23. A charged particle mirror, comprising:

a substrate;

a mirror element having a pillar recessed with respect to a surface of the substrate;

wherein the pillar comprises one of:

a conductive connection configured for connecting the pillar to a voltage source;

a conductive element being configured for generating a curved equipotential surface when a voltage is applied;

and wherein the pillar is rotationally symmetric.

* * * * *